United States Patent

[11] 3,577,847

[72] Inventor Ronald A. Scranton
1025 E. Thompson Ave., Hoopeston, Ill. 60942

[21] Appl. No. 807,541
[22] Filed Mar. 17, 1969
[45] Patented May 11, 1971

[54] COMPONENT PART INSERTER FOR CIRCUIT BOARD
15 Claims, 11 Drawing Figs.

[52] U.S. Cl. 29/203
[51] Int. Cl. H05k 3/30
[50] Field of Search 29/203 (B), 203 (DT)

[56] References Cited

UNITED STATES PATENTS

| | | | |
|---|---|---|---|
| 2,902,689 | 9/1959 | Petersen | 29/203B |
| 2,978,707 | 4/1961 | Runciman | 29/203B |
| 3,004,262 | 10/1961 | Cubbidge et al. | 29/203B |
| 3,488,672 | 1/1970 | Maetyn | 29/203B |

*Primary Examiner*—Andrew R. Juhasz
*Assistant Examiner*—F. R. Blinsky
*Attorney*—Johnson, Dienner, Emrich, Verbeck & Wagner

ABSTRACT: In a machine for attaching electrical components to a circuit board, wherein each of the electrical components has a body and a pair of generally aligned oppositely extending leads, and wherein the circuit board has preformed holes arranged in pairs to receive the leads of the respective electrical components, a reciprocable ram member cooperates with suitable lead-cutting dies and lead-forming cam means in cutting the leads of the respective electrical components to predetermined lengths, forming the leads so as to permit the leads to be driven through a selected pair of holes in the circuit board, and driving the leads therethrough.

Inventor:-
Ronald A. Scranton,
By Brown, Jackson, Boettcher & Dienner
Attys.
1.

COMPONENT PART INSERTER FOR CIRCUIT BOARD

BACKGROUND OF THE INVENTION

This invention pertains to improvements in machines for attaching electrical components such as semiconductor diodes and resistors to circuit boards.

Typically, semiconductor diodes, resistors, and other electrical components of similar external construction have fragile generally cylindrical bodies and slender, easily bent leads, which usually are made of copper, and which are generally aligned and extended from the opposite ends of the bodies. Usually, the leads are supplied by the manufacturers in standard lengths. As a result, before the leads can be inserted through a selected pair of preformed holes in a circuit board, the leads must be cut to predetermined lengths and suitably formed.

In the prior art, there are a number of machines of the type in which the leads of the respective electrical components are cut, formed and inserted. For example, see U.S. Pat. No. 3,167,780, in which a machine is disclosed having separate cutting, forming and inserting members, and U.S. Pat. No. 2,791,722, in which a machine is disclosed having a combined cutting and forming member and a separate inserting member. These machines and others in the prior art tend to be prohibitively expensive to a small operator, principally because of the cost of providing two or more separate relatively movable members for cutting, forming and inserting the leads of the respective electrical components. The separate relatively movable members must be precisely machined, particularly at their interfaced bearing surfaces, and complicated linkages are required.

There is a need for machines in which simplified, less expensive mechanism is used in cutting, forming, and inserting the leads without loss of uniformity or reliability in the manner whereby the electrical components are attached. This invention is directed to satisfying this need.

SUMMARY OF THE INVENTION

Accordingly, it is an object of this invention to provide improvements in machines for attaching electrical components to circuit boards having preformed holes arranged in pairs to receive the leads of the respective electrical components.

It is another object of this invention to provide simplified, inexpensive mechanism for such a machine, by means of which mechanism the leads of the respective electrical components are cut to predetermined lengths, suitably formed, and driven through a selected pair of the preformed holes in a circuit board.

It is another object of this invention to provide mechanism, as described, comprising a single reciprocable ram member in combination with suitably arranged lead-cutting dies and suitable lead-forming cam means.

It is a related object of this invention to provide a ram member, as mentioned, which is designed to replace separate cutting, forming, and inserting members.

In accordance with the principles of this invention, there is provided, in a machine for attaching electrical components to a suitably supported circuit board, mechanism comprising, in combination, a reciprocable ram member, guiding means for guiding the ram member for reciprocating movement with respect to the circuit board, lead-forming cam means mounted for movement between an operative position in the path of the ram member and an inoperative position cut such path and biased to the operative position, and a pair of spaced-apart lead-cutting dies supported at opposite sides of the path of the ram member and adapted to support the leads of the respective electrical components as the electrical components are fed one at a time into the path of the ram member between the ram member and the forming cam means.

Furthermore, the ram member has a pair of lead-cutting edges adapted to cooperate with the lead-cutting dies to cut the leads supported by the lead-cutting dies to predetermined lengths as the reciprocable ram member initially moves toward the circuit board and the lead-cutting edges engage the leads. Additionally, the reciprocable ram member has lead-forming surfaces adapted to form the leads against the lead-forming cam means, as the reciprocable ram member further moves toward the circuit board after the leads have been cut, so as to permit the leads to be driven through a selected pair of the preformed holes in the circuit board. Furthermore, the reciprocable ram member is adapted to move the lead-forming cam means to the inoperative position and drive the leads through the selected pair of preformed holes in the circuit board after the leads have been cut and formed.

These and other objects, features and advantages of this invention will become evident from the following description with the aid of the attached drawings of a presently preferred embodiment of this invention.

DESCRIPTION OF THE PREFERRED EMBODIMENT

Figures 1, 2, 3, 4:
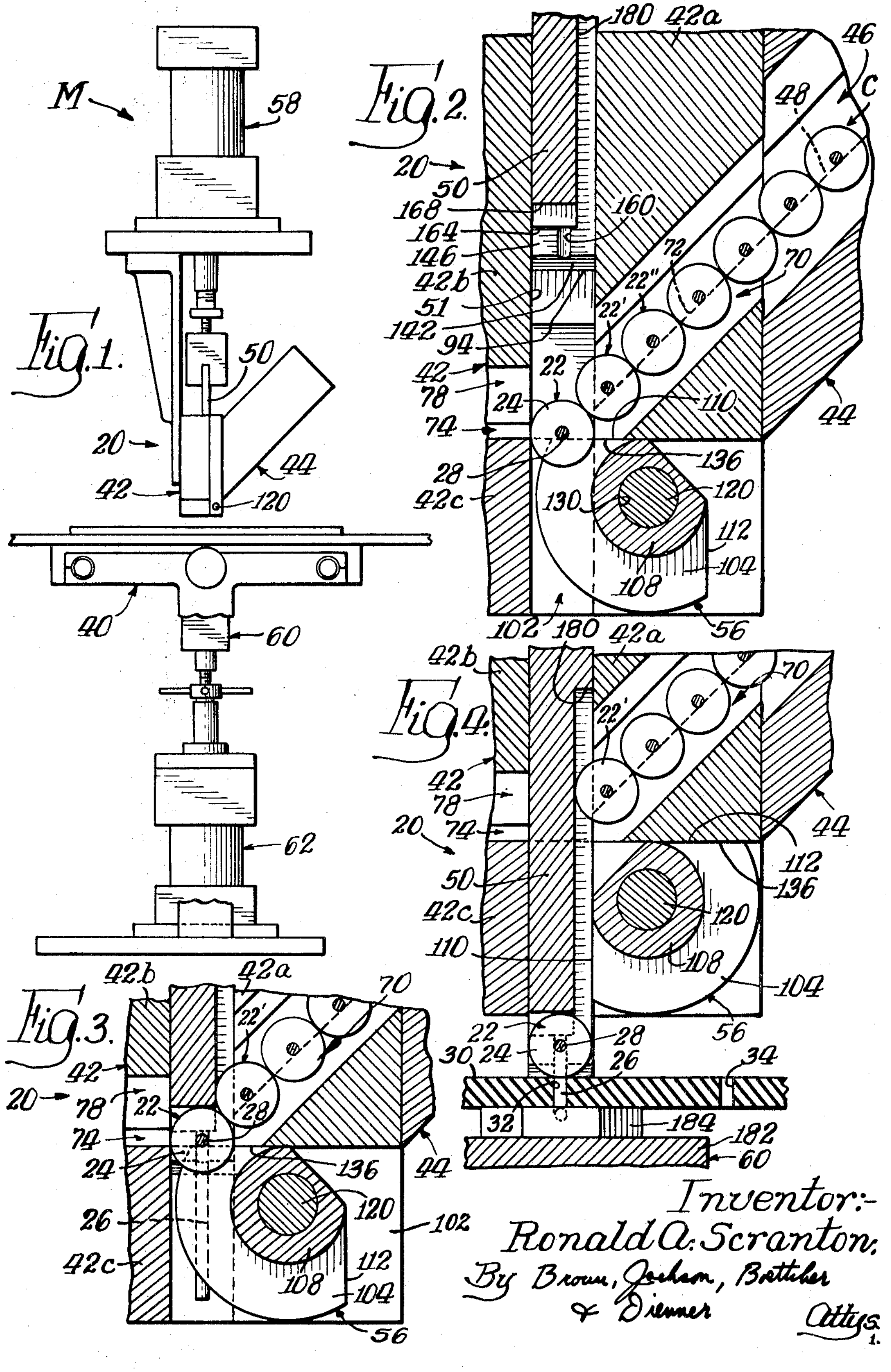
FIG. 1 is an essentially diagrammatic view of a machine in which mechanism embodying the principles of this invention has been incorporated.
FIG. 2 is a fragmentary vertical sectional view of portions of the machine of FIG. 1, taken essentially through the housing around and in which the foregoing mechanism is constructed, showing the reciprocable ram member in an elevated reset position.
FIGS. 3 and 4 are views similar to FIG. 2, showing the reciprocable ram member in changed positions with respect to the electrical component.

In the drawings, there are shown portions of a machine, indicated generally at M in FIG. 1, for attaching electrical components to a circuit board. The electrical components, indicated generally at C in FIGS. 2—4 are of the type having generally cylindrical bodies and slender, easily bent, generally aligned leads extended from the opposite ends of the bodies. Each of the circuit boards has preformed holes arranged in pairs to receive the leads of the respective electrical components C. The machine M incorporates mechanism, indicated generally at 20 throughout the drawings, for cutting the leads of the respective electrical components C to predetermined lengths, suitably forming the leads, and driving the leads through a selected pair of the preformed holes in one of the circuit boards. The mechanism 20 constitutes the presently preferred embodiment of this invention.

It should be understood that, apart from the mechanism 20 to be described in detail hereinafter details of the machine M are not needed for an understanding of this invention and are outside the scope of the present disclosure. Certain other elements of the machine M are mentioned briefly hereinafter for the purpose of placing the mechanism 20 in an exemplary setting.

To illustrate the operation of the mechanism 20, FIGS. 2-—10 show the machine M in various stages of operation in attaching one of the electrical components, indicated at 22, which has a generally cylindrical body 24 and extended leads 26 and 28, to a circuit board 30, which has a pair of preformed holes 32 and 34 arranged to receive the leads 26 and 28. Successive electrical components of similar construction are indicated at 22′, 22″, etc.

As shown, the machine M comprises a conventional indexing table 40, on which a circuit board may be supported and suitably positioned so as to place selected pairs of preformed holes therein in position to receive the leads of the respective electrical components C, and a housing 42, to which the mechanism 20 is operatively mounted. As shown, the housing 42 is a unitary assembly of a back member 42*a* and upper and lower front members 42*b* and 42*c*, respectively. The use of separate members facilitates the provision of the necessary grooves, recesses, and the like in the assembled housing 42. The separate members may be fastened together by means of countersunk machine screws or the like (not shown).

In the machine M, the electrical components C are fed one at a time through the housing 42 into position to be attached to an associated circuit board such as the circuit board 30. This may be accomplished either by gravity or mechanically, as is known. As shown, the respective electrical components C are fed by gravity through a magazine chute 44 having an enlarged interior opening 46 characterized by inclined shoulders 48 (one shown) on which the respective leads of the electrical components C are carried. The interior opening 46 of the magazine chute 44 is wide enough to accommodate the uncut leads of the electrical components 22. Preferably, the electrical components 22 are loose, as shown. In the alternative, the extremities of the leads of the electrical components 22 may be taped or ribboned together in conventional manner, or the components may be otherwise associated in a known way.

The mechanism 20 of this invention generally comprises a reciprocable ram member 50 guided within a vertically oriented channel 51 which is formed in the front members 42*b* and 42*c* of the housing 42, for reciprocating movement in a path essentially perpendicular to the indexing table 40 and thus to a circuit board such as the circuit board 30 supported by the indexing table 40; a pair of lead-cutting dies 52 and 54 (FIG. 5) supported at opposite sides of the path of the ram member 50; and lead-forming cam means 56 mounted for movement between an operative position in the path of the ram member (FIGS. 2 and 3) and an inoperative position out of the path of the ram member 50 (FIG. 4) and biased to the operative position.

The foregoing elements of the mechanism 20, which are described in detail hereinafter may be actuated in conventional manner. As shown, the ram member 50 is actuated by conventional air cylinder mechanism 58 (FIG. 1). Furthermore, after attachment to a circuit board such as the circuit board 30, the leads of the respective electrical components 22, 22′, etc. may be clinched by means of a conventional clinch die assembly 60 which, as shown in FIG. 1, is actuated by conventional air cylinder mechanism 62. Details of the air cylinder mechanisms 58 and 62 of suitable controls therefore are outside the scope of the present disclosure and may be supplied readily by those skilled in the art. The air cylinder mechanism 58 is used to drive the ram member 50 downwardly from an elevated reset position to cut, form, and drive the leads of the respective electrical components. It also serves to raise the ram member 50.

The air cylinder mechanism 62 is used to bring the clinch die assembly 60 up from a depressed reset position to clinch the leads of the respective electrical components. It also may be used to withdraw the clinch die assembly 60.

The back member 42*a* of the housing 42 has an inclined channel 70 formed therein serving as a continuation of the magazine chute 44 and having suitable inclined shoulders 72 (one shown) onto which the leads of the respective electrical components 22, 22′, etc. are guided after they pass from the inclined shoulders 48 of the magazine chute 44. The front members 42*b* and 42*c* of the housing 42 define slots, at 74 and 76, to accommodate the uncut leads of the respective electrical components 22, 22′, etc. as the electrical components pass from the inclined shoulders 72 onto the lead cutting dies 52 and 54, and the front members 42*b* and 42*c* further define recesses at 78 and 80, to permit the path of the ram member 50 to be cleared easily of scrap or foreign matter when necessary. By means of the magazine chute 44 and the inclined channel 70, the electrical components 22, 22′, etc. are fed one at a time by gravity into the path of the ram member 50, between the ram member 50 and the lead-forming cam means 56, with the leads of the respective electrical components 22, 22′, etc. supported by the lead-cutting dies 52 and 54. The top surface of the lead-forming cam means 56, as shown in FIGS. 2 and 5, is at the same level as the top surface of the lead-cutting dies 52 and 54.

Figures 5, 6, 7, 8, 9, 10, 11:
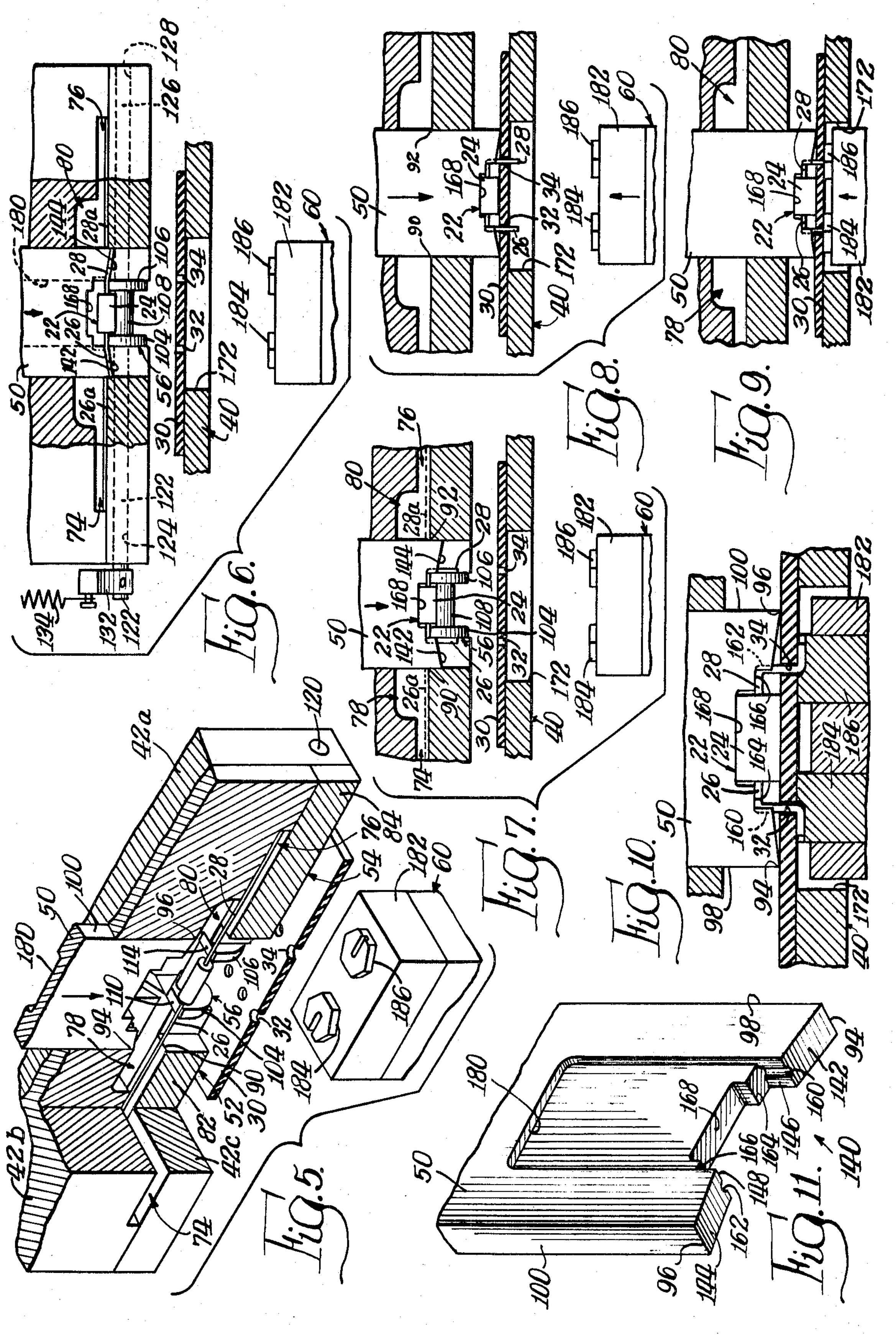
FIG. 5 is a fragmentary perspective view of the housing, partly in section, corresponding to FIG. 2.
FIGS. 6—9 are fragmentary elevational views of the housing, partly in section, showing the reciprocable ram member in sequentially changed positions with respect to the electrical component, FIG. 7 corresponding to FIG. 3 and FIG. 9 corresponding to FIG. 4.
FIG. 10 is a view similar to FIG. 9, further sectioned and on an enlarged scale.
FIG. 11 is a fragmentary perspective view of the reciprocable ram member.

In FIGS. 2 and 5 the electrical component 22 is shown as having been fed by gravity into the path of the ram member 50, between the ram member 50 and the lead-forming cam means 56, the ram member 50 having been actuated by the upper air cylinder mechanism 58 and moving downwardly. The leads 26 and 28 are shown as resting upon the respective lead-cutting dies 52 and 54. The succeeding electrical components 22′, 22″, etc. are shown as remaining in the channel 70 and in the magazine chute 44.

The lead-cutting dies 52 and 54 comprise respective cutting blocks 82 and 84 suitably mounted to the housing 42 beneath the slots 74 and 76 in open pockets (not numbered) in the underside of the housing 42. The cutting blocks 82 and 84 present spaced-apart cutting edges 90 and 92 at opposite sides of the path of the ram member 50. Scrap, such as trimmed leads, and foreign matter may be blown through the recesses 78 and 80 by compressed air or the like from a suitable source (not shown).

The ram member 50 has a pair of lead-cutting edges 94 and 96 which are continuous with the respective opposite side surfaces 98 and 100 of the ram member 50. The lead-cutting edges 94 and 96 of the ram member 50 and the spaced-apart cutting edges 90 and 92 of the respective lead-cutting dies 52 and 54 cooperate to cut the leads of the respective electrical components 22, 22′, etc. to predetermined lengths.

In FIG. 6, the leads 26 and 28 are shown as having been cut to predetermined lengths between the lead-cutting edges 94 and 96 of the ram member 50 and the spaced-apart cutting edges 90 and 92 of the respective lead-cutting dies 52 and 54. The scrap 26*a* and 28*a* from the leads 26 and 28 is shown in the slots 74 and 76, and the ram member 50 is shown as having further moved downwardly. The leads 26 and 28 are shown as being bent slightly from the horizontal at either side of the lead forming cam means 56.

The back member 42*a* of the housing 42 has an enlarged recess 102, opening into the channel 51 in which the ram member 50 is guided. The lead-forming cam means 56 comprises a pair of shoulder members 104 and 106 of equal width, spaced apart by a distance slightly greater than the axial extent of the bodies of the respective electrical components 22, 22′, etc. and connected by an integral tubular shaft 108. The shoulder member 104 is generally a truncated disc with a lead-supporting front flat surface 110 and a back flat surface 112 formed where the disc has been truncated, as is best shown in FIGS. 2—4. The shoulder member 106 is similar to the shoulder member 104 and has a lead-supporting front flat surface 114 (FIG. 5) and a back flat surface (not shown) and is similarly truncated. The lead-forming cam means 56 is supported by an elongated cylindrical dowel or axle 120 which is journaled in the back member 42*a* of the head 42, at its first end 122 in a suitable opening 124 at one side of the recess 102 and at its second end 126 in a suitable opening 128 at the opposite side of the recess 102. The dowel or axle 120 passes through an axial opening (not shown) in the shoulder member 104, through the bore 130 of the tubular shaft 108, and through an axial opening (not shown) in the shoulder member 106, and is keyed or made fast to the lead-forming cam means 56.

The first end 122 of the dowel or axle 120 extends through the back member 42*a* of the head 42 and is suitably attached to a crank arm 132 (FIG. 6). A suitably anchored tension spring 134, preferably of the helical type, acts on the crank arm 132 so as to bias the lead-forming cam means 56 to the operative position of FIGS. 2 and 5.

It may be noted that the front flat surfaces 110 and 114 of respective shoulder members 104 and 106 are adapted to engage the horizontal surface 136 defining the upper wall of the recess 102 to limit movement of the lead-forming cam means 56 toward the operative position (FIGS. 2 and 5). Furthermore, the back flat surfaces of the respective shoulder members 104 and 106, such as the surface 112 of the member 104, are adapted to engage the same upper surface 136 to limit movement of the lead-forming cam means 56 toward the inoperative position (FIG. 4). The front flat surfaces 110 and 114 of the respective shoulder members 104 and 106 support intact portions of the leads of the respective electrical components 22, 22', etc. after the leads have been cut, with the bodies of the respective electrical components disposed between the shoulder members 104 and 106 and spaced from the tubular shaft 108 so as to avoid contact with and possible damage to the bodies.

In FIG. 6, intact portions of the leads 26 and 28 are shown as being supported adjacent the body 24 of the component 22 by the front flat surfaces 110 and 114 of the respective shoulder members 104 and 106.

The spring 134 should be selected so as to apply sufficient biasing torque to the dowel or axle 20 through the crank arm 134 to maintain the lead-forming cam means 56 in the operative position while the leads of the respective electrical components are being formed. Because the leads of the respective electrical components 22, 22', etc. are slender and easily bent, the spring constant of the spring 134 need not be large, even if the crank arm 134 is short.

As is best shown in FIG. 11, the ram member 50 also has lead-forming surface means, indicated generally at 140, for forming the leads of the respective electrical components 22 against the lead-forming cam means 56 as the ram member 50 further moves toward the associated circuit board after the leads have been cut, as mentioned hereinbefore, so as to permit the leads to be driven through a selected pair of the preformed holes in the associated circuit board. The lead-forming surface means 140 is located between the lead-cutting edges 94 and 96 and comprises opposed outer lead forming surfaces 142 and 144, which are continuous with the lead-cutting edges 94 and 96, opposed inner lead-forming surfaces 146 and 148, which are angled relative to but are continuous with the outer lead-forming surfaces 142 and 144. The inner lead-forming surfaces include grooves 160 and 162 for purposes to be explained hereinafter.

The outer lead-forming surfaces 142 and 144 are inclined inwardly from the lead-cutting edges 94 and 96 and away from the associated circuit board, so as to be adapted to initiate bending of the unsupported portions of the leads of the respective electrical components 22, 22', etc. toward the associated circuit board. The inclination of surfaces 142 and 144 is also desirable to facilitate the cutting of the leads of the respective electrical components, since it is preferred that there be some angle of inclination between the respective outer lead-forming surfaces 142 and 144 and the horizontal.

In FIG. 6, the unsupported portions of the leads 26 and 28 of the electrical component 22 are shown as having been bent toward the circuit board 30 by the respective outer lead-forming surfaces 142 and 144. The initial bending of the unsupported portions of the leads inclinedly toward the circuit board facilitates proper engagement of the inner lead-forming surfaces 146 and 148 with the unsupported portions of the leads and facilitates the entry of the unsupported portions of the leads into the grooves 160 and 162 in the inner lead-forming surfaces 146 and 148.

It has been discovered that the angle of inclination between the respective outer lead-forming surfaces 142 and 144 and the horizontal is extremely important. If the angle is too large, the unsupported portions of the leads of the respective electrical components have a tendency to stray from proper alignment with the grooves 160 and 162 in the inner lead-forming surfaces 146 and 148. However, if the angle between surfaces 142 and 144 and the horizontal is too little, unsatisfactory results are achieved. It has been discovered that for satisfactory results to be consistently obtained, an angle of inclination of approximately 20° is preferred with no more than 10 percent variation therefrom.

The inner lead-forming surfaces 146 and 148 are essentially perpendicular to the associated circuit board so as to be adapted to further bend the unsupported portions of the leads of the respective electrical components 22 essentially perpendicularly toward the associated circuit board. The grooves 160 and 162 of the respective inner lead-forming surfaces 146 and 148 are adapted to receive bent portions of the leads of the respective electrical components 22, 22', etc. so as to prevent twisting of the leads with respect to the ram member 50. The grooves 160 and 162 also promote and assure the parallel directioning and uniform spacing of the unsupported portions of the leads.

In FIGS. 3 and 7, the leads 26 and 28 are shown as having been received by the grooves 160 and 162 of the respective inner lead-forming surfaces 146 and 148, and the unsupported portions of the leads 26 and 28 are shown as having been further bent essentially toward the circuit board 30 by the respective inner lead-forming surfaces 146 and 148.

As is best shown in FIG. 11, the ram member 50 further has lead-driving surfaces 164 and 166 between the inner lead-forming surfaces 146 and 148 and a cavity 168 between the lead-driving surfaces 164 and 166.

The lead-driving surfaces 164 and 166 between the inner lead-forming surfaces 146 and 148 are essentially horizontal and are adapted to engage the supported portions of the leads whose unsupported portions have been bent to a vertical position, so as to move the lead-forming cam means 56 to the inoperative position, and so as to drive the leads through the selected pair of the preformed holes in the adjacent circuit board as the ram member 50 further moves toward the associated circuit board after the leads have been cut and formed. The driven leads extend into an enlarged opening 172 in the indexing table 40. See FIG. 8. It may be noted that the upper ends of the aforementioned grooves 160 and 162 assist the lead-driving surfaces 164 and 166.

The cavity 168 in the ram member 50 receives the bodies of the respective electrical component 22, 22', etc. when the inner lead-driving surfaces 164 and 166 engage the portions of the leads supported by the lead-forming shoulder members 104 and 106, so as to avoid engagement of the bodies with the ram member 50. The inner lead-driving surfaces 164 and 166 are spaced vertically from the lead-cutting edges 94 and 96 for a sufficient amount that the lead-cutting edges 94 and 96 engage the associated board with the fragile bodies of the respective electrical components 22, 22', etc. resting against the associated circuit board when the leads are driven through the selected pair of preformed holes in the associated circuit board, and when the end of the stroke of the ram 50 occurs. See FIG. 8. As a result, damage to the bodies of the respective electrical components 22, 22', etc. is prevented.

In FIG. 8, such portions of the leads 26 and 28 as had been supported by the respective lead-forming shoulder members 104 and 106 are shown as having been engaged by the respective lead-driving surfaces 164 and 166, the body 24 of the electrical component 22 is shown as having been received by the cavity 168 in the ram member 50, and the leads 26 and 28 are shown as having been driven through the preformed holes in the circuit board 30. As shown, the ram member 50 has come to rest with the lead-cutting edges 94 and 96 engaging the circuit board 30 and with the body 24 of the electrical component 22 resting against the circuit board 30. The clinching die assembly 60 has been actuated by the air cylinder mechanism 62 and is moving upwardly as is indicated by the arrow.

As is best shown in FIGS. 2–4, the back surface of the ram member 50 preferably has a recess 180 against which the next-succeeding electrical component 22' rests during downward movement of the ram member 50. Thus, possible damage to the bodies of the electrical components 22', etc. in the channel 70 is avoided.

As is best shown in FIG. 5, the aforementioned conventional clinch die assembly 60 comprises a base 182 and a pair of integrally mounted hardened steel clinch dies 184 and 186. The clinch die assembly 60 is adapted to clinch the leads of the respective electrical components 22, 22′, etc. outwardly after the leads have been driven through the preselected pair of holes in the associated circuit board and the clinch die assembly 60 has been brought up to the underside of the associated circuit board. As shown, the clinch die assembly 60 passes through a suitable opening 188 in the indexing table 40.

In FIGS. 4, 9 and 10, the clinch die assembly 60 is shown as having come to rest with the clinch dies 184 and 186 engaging, or almost engaging, the underside of the circuit board 30, and the leads 26 and 28 of the electrical component 22 are shown as having been clinched outwardly by the respective clinch dies 184 and 186.

Clinching of the leads may not be necessary if the leads closely fit the holes in the circuit board, for example, with clearance no greater than 0.001 inch. The mechanism 20 described hereinbefore is capable of forming the leads of the respective electrical components 22, 22′, etc. with the necessary precision for such a close fit. In such an instance, it is preferred that the leads extend approximately 0.03 inch beneath the circuit board to facilitate the production of soldered connections to the leads.

The operation of the mechanism may be briefly summarized as follows. The electrical components 22, 22′, etc. are fed one at a time between the ram member 50 and the lead-forming cam means 56. On the downward stroke of the ram member 50, the leads of the respective electrical components 22, 22′, etc. first are cut to predetermined lengths between the lead-cutting edges 94 and 96 of the ram member 50 and the spaced-apart cutting edges 90 and 92 of the respective lead-cutting dies 52 and 54.

Thereupon, the leads of the respective electrical components 22, 22′, etc. are formed against the lead-forming cam means 56, as the ram member 50 further moves downwardly after the leads have been cut, so as to permit the leads to be driven through a selected pair of preformed holes in a circuit board supported by the indexing table 40. Then, the leads of the respective electrical components 22 22′, etc. are driven through such holes in the circuit board to be clinched if desired.

It should be understood that the foregoing description of the presently preferred embodiment of this invention is given solely by way of example and that modifications thereof and improvements thereto may be suggested by this disclosure to those skilled in the art. Accordingly, the scope of this invention should be determined from the following claims.

I claim:

1. In a machine for attaching electrical components to a suitably supported circuit board wherein each of the electrical components has a body and a pair of generally aligned oppositely extending leads and the circuit board has preformed holes arranged in pairs to receive formed leads of the respective electrical components, the combination comprising a reciprocatable ram member, guiding means for guiding said ram member for reciprocating movement with respect to the circuit board, lead-forming cam means mounted for movement between an operative position in the path of said ram member and an inoperative position out of said path and biased to said operative position, and a pair of spaced-apart lead-cutting dies supported at opposite sides of the path of said ram member and adapted to support the leads of the respective electrical components as the respective electrical components are fed one at a time into the path of said ram member between said ram member and said forming cam means, said ram member having a pair of lead-cutting edges adapted to cooperate with said lead-cutting dies to cut said leads to predetermined lengths as said ram member initially moves toward the circuit board and said lead-cutting edges engage said leads said ram member further having lead-forming surface means for forming said leads against said lead-forming cam means as said ram member further moves toward the circuit board after said leads have been cut, said ram member being adapted to move said lead-forming cam means to said inoperative position and drive said leads through the selected pair of preformed holes in the circuit board as said ram member further moves toward the circuit board after said leads have been cut and formed.

2. The combination of claim 1 wherein said lead-cutting edges are continuous with respective opposite side portions of said ram member.

3. The combination of claim 1 wherein portions of said lead-forming surface means are disposed at an angle leading way, upwardly, from said lead-cutting edges and away from the circuit board.

4. The combination of claim 1 wherein portions of said lead-forming surface means are disposed at an angle leading away, upwardly, from said lead-cutting edges and away from the circuit board approximately 20° relative to the leads to be cut.

5. The combination of claim 1 wherein said lead-forming cam means comprises a pair of lead-supporting shoulders adapted to support portions of the leads of the respective electrical components on opposite sides of and adjacent to the bodies of said electrical components after said leads have been cut and while said lead-forming cam means is in said operative position.

6. The combination of claim 1 wherein said lead-forming cam means is operatively associated with said guiding means in a recess in said guiding means, one surface of said recess serving to limit movement of said lead-forming cam means both toward said operative position and toward said inoperative position.

7. The combination of claim 6 wherein said lead-forming cam means comprises an axle supported by said guiding means for movement of said lead-forming cam means between said operative position and said inoperative position.

8. The combination of claim 5 wherein said ram member further has lead-driving surfaces adapted to engage the portions of said leads supported by said lead-supporting shoulders so as to move said lead-forming cam means to said inoperative position and drive said leads through the selected pair of the preformed holes in the circuit board as said reciprocable ram member further moves toward said circuit board after said leads have been cut and formed.

9. The combination of claim 8 wherein said ram member further has a cavity between said lead-driving surfaces adapted to receive the bodies of the respective electrical components as said lead-driving surfaces engage the portions of said leads supported by said lead-supporting shoulders so as to avoid engagement of said ram member with said bodies.

10. The combination of claim 1 wherein said lead-forming surface means comprises outer lead-forming surfaces continuous with said respective lead-cutting edges and inclined inwardly from said lead-cutting edges and away from the circuit board so as to be adapted to bend the unsupported portions of said leads inclinedly toward the circuit board.

11. The combination of claim 10 wherein said lead-forming surface means further comprises inner lead-forming surfaces continuous with said outer lead-forming surfaces and essentially perpendicular to the circuit board so as to be adapted to further bend the unsupported portions of said leads essentially perpendicularly toward the circuit board.

12. The combination of claim 11 wherein said inner lead-forming surfaces include grooves adapted to receive the unsupported portions of said leads so as to prevent twisting of the leads of the respective electrical components with respect to said ram member.

13. The combination of claim 12 wherein said ram member further has lead-driving surfaces between said inner lead-forming surfaces and adapted to engage the portions of said leads supported by said lead-supporting shoulders so as to move said lead-forming cam means to said inoperative position and drive said leads through the selected pair of the preformed holes in the circuit board as said ram member further moves toward the circuit board after said leads have been cut and formed.

14. The combination of claim 13 wherein said ram member further has a cavity between said lead-driving surfaces adapted to receive the bodies of the respective electrical components as said lead-driving surfaces engage the portions of said leads supported by said lead-supporting shoulders so as to avoid engagement of said ram member with said bodies.

15. The combination of claim 13 wherein said lead-forming surfaces are adapted to assist said lead-driving surfaces.